(12) United States Patent
Bhatnagar et al.

(10) Patent No.: US 10,571,771 B2
(45) Date of Patent: *Feb. 25, 2020

(54) OPTICAL DEVICE FABRICATION

(71) Applicant: View, Inc., Milpitas, CA (US)

(72) Inventors: Yashraj Bhatnagar, Santa Clara, CA (US); Robert T. Rozbicki, Los Gatos, CA (US); Rao Mulpuri, Saratoga, CA (US)

(73) Assignee: View, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/147,291

(22) Filed: Sep. 28, 2018

(65) Prior Publication Data

US 2019/0033678 A1    Jan. 31, 2019

Related U.S. Application Data

(63) Continuation of application No. 14/347,227, filed as application No. PCT/US2012/057606 on Sep. 27, 2012, now Pat. No. 10,126,622.

(Continued)

(51) Int. Cl.
*G02F 1/1523* (2019.01)
*G02F 1/153* (2006.01)
(Continued)

(52) U.S. Cl.
CPC ........ *G02F 1/1523* (2013.01); *C03C 17/3417* (2013.01); *C03C 17/3642* (2013.01);
(Continued)

(58) Field of Classification Search
CPC .. B05D 3/12; B05D 5/12; C03B 27/00; C03B 2217/94; C03B 2218/31; C03B 17/417;
(Continued)

(56) References Cited

U.S. PATENT DOCUMENTS 5,080,471 A     1/1992  Cogan et al.
5,900,275 A  *  5/1999  Cronin .................... G02B 1/10
                                                       427/108

(Continued)

FOREIGN PATENT DOCUMENTS

CN       102203370 A    9/2011
JP       2001 133816 A  5/2001
(Continued)

OTHER PUBLICATIONS

Choi et al., "Behaviour of Electrical and Optical Properties of Indium Tin Oxide Transparent Electrode After CMP Process," Electronics Letters, Apr. 13, 2006, vol. 42, No. 8, 2 pages.
(Continued)

*Primary Examiner* — Brian K Talbot
(74) *Attorney, Agent, or Firm* — Weaver Austin Villeneuve & Sampson LLP; Brian D. Griedel (57) ABSTRACT

Transparent conductive coatings are polished using particle slurries in combination with mechanical shearing force, such as a polishing pad. Substrates having transparent conductive coatings that are too rough and/or have too much haze, such that the substrate would not produce a suitable optical device, are polished using methods described herein. The substrate may be tempered prior to, or after, polishing. The polished substrates have low haze and sufficient smoothness to make high-quality optical devices.

18 Claims, 4 Drawing Sheets

Related U.S. Application Data (60) Provisional application No. 61/541,999, filed on Sep. 30, 2011.

(51) Int. Cl.

| | | |
|---|---|---|
| *G02F 1/155* | (2006.01) | |
| *C03C 17/34* | (2006.01) | |
| *C03C 17/36* | (2006.01) | |
| *B05D 5/12* | (2006.01) | |
| *C23C 16/02* | (2006.01) | |
| *B05D 3/12* | (2006.01) | |
| *C03B 27/00* | (2006.01) | |

(52) U.S. Cl.
CPC ............ *G02F 1/155* (2013.01); *G02F 1/1533* (2013.01); *B05D 3/12* (2013.01); *B05D 5/12* (2013.01); *C03B 27/00* (2013.01); *C03C 2217/94* (2013.01); *C03C 2218/31* (2013.01); *C23C 16/0254* (2013.01); *Y02P 40/57* (2015.11)

(58) Field of Classification Search
CPC ........................ C03B 17/3642; C03B 16/0254; G02F 1/1523
USPC .......................................................... 427/58
See application file for complete search history.

(56) References Cited

U.S. PATENT DOCUMENTS

| | | | |
|---|---|---|---|
| 6,171,646 B1 | 1/2001 | Gerhardinger | |
| 6,268,059 B1 | 7/2001 | Cronin et al. | |
| 10,126,622 B2 | 11/2018 | Bhatnagar | |
| 2003/0181142 A1* | 9/2003 | De Rege Thesauro | B24B 37/044 |
| | | | 451/36 |
| 2005/0213184 A1 | 9/2005 | Beteille et al. | |
| 2006/0268385 A1* | 11/2006 | Guarr | G02F 1/153 |
| | | | 359/265 |
| 2007/0190789 A1 | 8/2007 | Carter et al. | |
| 2010/0165440 A1 | 7/2010 | Nguyen et al. | |
| 2010/0243427 A1* | 9/2010 | Kozlowski | C03C 17/3417 |
| | | | 204/192.1 |
| 2010/0321758 A1* | 12/2010 | Bugno | B60R 1/088 |
| | | | 359/267 |
| 2016/0139475 A1 | 5/2016 | Garcia et al. | |
| 2016/0200621 A1 | 7/2016 | N'Gom et al. | |

FOREIGN PATENT DOCUMENTS

| | | |
|---|---|---|
| JP | 2005 093318 A | 4/2005 |
| WO | WO 2012/056240 | 5/2012 |

OTHER PUBLICATIONS

International Search Report and Written Opinion dated Feb. 21, 2013, issued in PCT/US2013/034998.
Extended European Search Report dated Dec. 11, 2014 in EP Application No. 12837359.4.
European Office Action dated Dec. 3, 2015 in EP Application No. 12837359.4.
Chinese Office Action dated Oct. 9, 2015 in CN Application No. 201280054903.7.
International Preliminary Report on Patentability dated Apr. 10, 2014 in PCT/US2013/034998.
Chinese Office Action dated Jun. 20, 2016 in CN Application No. 201280054903.7.
U.S. Supplemental Notice of Allowance dated Jul. 31, 2018 in U.S. Appl. No. 14/347,227.
U.S. Notice of Allowance dated Jul. 2, 2018 in U.S. Appl. No. 14/347,227.
U.S. Final Office Action dated Nov. 2, 2017 in U.S. Appl. No. 14/347,227.
U.S. Office Action dated Jul. 17, 2017 in U.S. Appl. No. 14/347,227.
U.S. Final Office Action dated Feb. 1, 2017 in U.S. Appl. No. 14/347,227.
U.S. Office Action dated Sep. 13, 2016 in U.S. Appl. No. 14/347,227.
U.S. Final Office Action dated May 10, 2016 in U.S. Appl. No. 14/347,227.
U.S. Office Action dated Oct. 26, 2015 in U.S. Appl. No. 14/347,227.
Extended European Search Report dated Nov. 23, 2018 in EP Application No. 18193049.6.

\* cited by examiner

OPTICAL DEVICE FABRICATION

CROSS REFERENCE TO RELATED APPLICATIONS

This application is a continuation of U.S. patent application Ser. No. 14/347,227, filed Mar. 25, 2014, entitled "Optical Device Fabrication", which is a national stage application under 35 U.S.C. § 371 to International Application Number PCT/US2012/057606 (designating the United States), filed on Sep. 27, 2012 and entitled "Optical Device Fabrication", which claims benefit of U.S. Provisional Application No. 61/541,999, filed on Sep. 30, 2011, and entitled "Optical Device Fabrication", the disclosures of which are hereby incorporated by reference in their entirety and for all purposes.

FIELD

The disclosure relates to smoothing the topology of transparent conductive oxide coatings. More specifically, roughness is mitigated in order to create more uniform coatings upon which to fabricate optical devices.

BACKGROUND

Optical device technology, e.g. electrochromic device technology, has advanced to the point where such devices can be fabricated using individual layers of materials that make up a "device stack" that is very thin, e.g., on the order of a few microns or even less than a micron in thickness. With such devices being very thin, uniformity of the substrate onto which they are fabricated is important, because the individual layers of the device stack may be on the order of tens or hundreds of nanometers thick. Non-uniformity in the substrate surface can translate into areas of the device stack that do not function properly or exhibit electrical shorting or other defectivity. Defectivity in the device stacks can often be correlated to the surface roughness of the substrate onto which the device stack is fabricated.

With small-scale production, e.g. in a research and development phase, a substrate can be carefully selected or fabricated for very high uniformity so that the above-described issues do not arise. As electrochromic device fabrication moves to large-scale production, it is more practical to purchase large area substrates, e.g. float glass coated with a transparent conducting film, from commercial sources that produce such substrates in large volume. The problem that often arises in such substrates is surface roughness of the pre-formed coatings thereon. For example, float (soda lime) glass is commercially offered with a bilayer coating on one surface. The bilayer includes a first layer which is a sodium diffusion barrier to prevent sodium ions from the glass from passing through it, and a second layer on the first layer which is a transparent conducting layer, e.g., a doped tin oxide such as indium tin oxide, fluorinated tin oxide, or similar transparent conducting coating. These coated glasses are well suited for a number of applications, including production of optical coatings thereon; however, for functioning device stacks on the order of a few microns or less in thickness, the surface roughness of these pre-formed coatings may be problematic at least for the reasons articulated above.

Also, there is an inverse relation between the desired properties of a glass substrate for optical coatings and some of the actual properties of the glass substrate when one moves to large scale production. For example, it is desirable to have a transparent conducting coating (e.g., film) with low sheet resistance across a glass substrate with an electrochromic device fabricated thereon. The lower the sheet resistance, the faster the electrochromic device may be able to switch. However, when moving to large scale substrate production, in order to produce highly reliable coatings, transparent conductors are generally made with larger grain size. Oftentimes these transparent coatings will have a low sheet resistance, but will also have a higher haze (light scattering) due to the larger grain size of the coatings. This haze is not a desired property of some final optical device products, e.g., electrochromic windows having electrochromic devices. For such windows, clarity and high contrast are important qualities. The larger grain size also contributes to the surface roughness, which is undesirable for the reasons described above. For context, transparent conductor coatings in large scale production substrates may have a surface roughness (Ra) of about 7 nm to 10 nm, and sometimes higher than 10 nm. For conventional applications, these surface roughness and haze properties may be considered well within acceptable levels or desired levels. For example, some optical device applications, such as photovoltaic cells, benefit from higher haze and roughness levels due to the increased scattering of incident light improving absorption efficiency. There may not be a need to polish a transparent conducting layer for these conventional applications.

There have been studies on polishing transparent conducting layers on glass. For example, indium tin oxide (ITO) layers have been polished using magnetorheological finishing (MRF) which resulted in a surface with surface roughness down to a few nanometers (see e.g., www.optics.rochester.edu/workgroups/cml/opt307/spr07/chunlin/, last visited Sep. 30, 2011). Also, the surface roughness of ITO layers has been reduced using KrF excimer lasers (see J. Vac. Sci. Technol. A 23, 1305 (2005). However, these techniques are highly specialized and prohibitively expensive to implement on large area substrates and/or in a mass production setting. One reported method of reducing haze in tin oxide coatings describes, rather than polishing the roughness down, filling in the valleys to smooth the overall contour of the coating (see U.S. Pat. No. 6,268,059). Compositions and methods that use acidic zirconia or colloidal silica for chemical mechanical polishing of ITO have also been reported (see US 2007/0190789). Despite these advances, there is a continuing need for new and improved methods of reducing haze and smoothing the surface of transparent conductive coatings.

SUMMARY

Transparent conductive coatings are polished using particle slurries in combination with mechanical shearing force, such as can be provided by a polishing pad. Substrates having transparent conductive coatings that are too rough and/or have too much haze, such that the substrate would not produce a suitable optical device, are polished using methods described herein. The substrates may be tempered prior to, or after, polish. The polished substrates have low haze and sufficient smoothness to make high-quality optical devices.

Abrasive particles of between about 0.1 μM and about 1 μM average diameter can be used. In certain embodiments, particles of 0.25 μM or larger average diameter are used. In one embodiment alumina particle slurries are used. In a particular embodiment, alumina slurries with particles of average diameter of between about 0.25 μM and about 1 μM are used. These and other aspects are described in more detail below. In one embodiment, alumina slurries with particles of average diameter of about 1 µM are used.

DETAILED DESCRIPTION

The inventors have found that for electrochromic devices having an overall thickness in the range of a few microns or less, where individual layers of the device stack are on the order of 600 nm or less, and sometimes as thin as tens of nanometers, the surface roughness may be too high and the haze of the final product (e.g., electrochromic window) may be unacceptable given the high clarity and contrast demanded by the market. The surface roughness, if too high, of a transparent conducting layer can adversely affect the functionality of an optical device, e.g. an electrochromic device, fabricated thereon. Also, the market demands optical devices and their final products have very low haze. For example, electrochromic windows are oftentimes deemed unacceptable if their level of haze is above 1%.

Methods described herein mitigate surface roughness and/or haze of a substrate prior to device fabrication thereon. These methods are particularly applicable for use on transparent conducting layers on glass substrates. Even more particularly, the methods are useful to mitigate roughness and/or haze on transparent conductive coatings that are produced via pyrolytic methods, i.e., where the roughness and haze of the coatings produced by such methods may be acceptable for other uses, but not so for optical device fabrication. Methods described herein allow the use of such "crude" coatings in the production of highly-specialized device coatings, such as electrochromic coatings for electrochromic windows. Using methods described herein, the surface roughness and haze of such transparent conductive coatings are reduced significantly.

In an attempt to reduce haze, the inventors conceived of methods described herein, and were quite surprised to find that optical device functionality was also dramatically improved. That is, it was known that "spikes" in the topography of transparent conductors can cause electrical shorts by crossing the layers of an electronic device fabricated on the transparent conducting layer. However, it was not known that lesser roughness would improve the functionality of an optical device to such a degree as has been found with methods described herein. In fact, roughness in the transparent conducting layer of some previous optical devices (e.g., photovoltaic cells) had been described as actually being beneficial (See International Publication No. WO 2012/056240). In contrast, it was found that the methods described herein reduced roughness and also improved the functionality of electrochromic devices. For example, all solid state and inorganic electrochromic devices have a higher resistance to moisture incursion (reduced hermiticity) when fabricated on substrates polished using methods described herein, versus substrates without such treatment. Without wishing to be bound by theory, it is believed that by starting with a smoother substrate, there is less "memory effect" in that the solid state materials deposited on the polished substrates do not mimic, or are not adversely affected by, what would otherwise be a very rough topography. For example, crystalline materials may develop or form with fissures or crystal dislocations that can allow moisture incursion into the lattice.

Mitigation of surface roughness can be performed on a transparent conducting layer of a glass substrate prior to, or after, a tempering process. Advantages of these methods may include smoothing the surface of the transparent conducting layer, thereby decreasing defectivity in the electrochromic device fabricated thereon, and also decreasing haze in the final transparent substrate. Other advantages may include normalization of the surface of the transparent conducting layer, thereby decreasing the amount and variation in contaminants on the surface (e.g., interleave compounds, organic residues, particles and the like which are on the glass as purchased). When the methods described herein are performed prior to, or without, tempering, advantages may include normalizing the glass surface prior to cutting to size, therefore increasing yield, whether or not the glass is eventually tempered (e.g., the glass may not be tempered but instead laminated to strengthen the glass). When the methods described herein are performed after tempering, advantages may include normalizing any surface roughness or irregularities that may have arisen as a result of the tempering process that would otherwise detrimentally affect the device stack performance. That is, glass tempering uses very high temperatures, and the morphology of coatings on the glass may change during the tempering process. Polishing the glass after tempering mitigates changes in topology due to morphology shift as a result of the tempering process.

One embodiment is a method of fabricating an electrochromic device on a glass substrate having a transparent conducting layer thereon, the method including polishing the surface of the transparent conducting layer to reduce the surface roughness and then fabricating the electrochromic device thereon. In one embodiment, the glass substrate is tempered prior to fabrication of the electrochromic device thereon. In another embodiment, the surface of the transparent conducting layer is polished without first tempering the glass substrate. In one embodiment, the surface of the transparent conducting layer is polished as described herein and then the glass substrate is tempered. Another embodiment is an electrochromic device fabricated on a glass substrate having a polished transparent conductive layer thereon. In one embodiment, the glass substrate is coated with a tin oxide based transparent conductive layer. In one embodiment, the tin oxide based transparent conductive layer is ITO (indium tin oxide) or TEC (fluorinated tin oxide). In a specific embodiment, the tin oxide based transparent conductive layer is TEC that has been applied to the glass substrate via a pyrolytic method; that is, a precursor material is sprayed or otherwise applied as a solution to the glass substrate and then high heat is used to burn away components of the precursor material to leave a TEC coating on the glass substrate.

Polishing the surface of a transparent conducting layer may be done mechanically using an abrasive preparation, e.g., alumina, ceria, and the like. Commercially available polishing abrasives, e.g., slurried abrasive preparations having average particle sizes of between about 0.1 µm and about 10 µm, may be used. In certain embodiments, particles with average diameters at the larger end of the aforementioned spectrum are used. In one embodiment, particles with an average diameter of between about 0.25 µm and about 10 µm are used. In certain embodiments, alumina (aluminum oxide) particles are used as the abrasive component.

Alumina, as measured on Mohs hardness scale, has a value of 9 (diamond being 10). Thus, alumina is harder than other common polishing agents such as, ceria (6 on Mohs scale), zirconia (8 on Mohs scale) or silica (8 on Mohs scale). Without wishing to be bound by any particular theory, it is believed that alumina may offer superior polishing of transparent conductors, because of the significant difference in hardness of alumina as compared to transparent conductors, such as tin oxide based materials (e.g. tin oxide has a Mohs value of 6.5). At the same time, alumina is relatively inexpensive as compared to, e.g., corundum (9 on Mohs scale) or diamond. In one embodiment, alumina particles having an average particle diameter of about 0.25 µm are used in a slurry preparation to mechanically polish the transparent conducting layer. In another embodiment, alumina particles having an average particle diameter of about 0.5 µm are used in a slurry preparation to mechanically polish the transparent conducting layer. In yet another embodiment, alumina particles having an average particle diameter of about 1 µm are used in a slurry preparation to mechanically polish the transparent conducting layer.

Since reflective measurements are less useful with transparent layers, the time and amount of polishing can be determined, e.g., by measuring the sheet resistance of the transparent conducting layer and ceasing polishing while the sheet resistance remains at an acceptable level. That is, as the polishing operation is carried out, the sheet resistance of the transparent conducting layer will increase due to the thinning of the layer due to removal by polishing. The polishing operation may be stopped before the sheet resistance of the transparent conducting layer increases to an unacceptable level. For example, the polishing operation may cease when the measured sheet resistance of the glass substrate is at or near (i.e. slightly above or below) an acceptable level (i.e. maximum acceptable sheet resistance). Sheet resistance may be measured, e.g., periodically measured, during the polishing operation. In this example, the time and amount of polishing is based on the measurement of the sheet resistance at or near the acceptable level. In one embodiment, the polishing is performed for about 10 minutes to about 3 hours, in another embodiment about 30 minutes to about 2 hours, and in another embodiment for about 1.5 hours.

It has been found that by polishing the transparent conducting layer prior to fabrication of an electrochromic device thereon, defectivity in the electrochromic device is reduced. This result is not only due to reduction of "spikes" in the transparent conductive layer that can cause shorting shunts through the layers of the electrochromic device, but also the surface roughness can affect adhesion of the layers deposited thereon. Also, there is the aforementioned "memory effect" when the rough topology of the transparent conducting layer is transferred to the layers of the electrochromic device. That is, the rough topology may orient crystalline layers atop the transparent conductor and adversely affect ionic and/or electrical conduction.

Further, it has been found that substrates with transparent conducting layers that have larger grain size, which are rougher but have lower sheet resistance, can be used; the transparent conducting layer's sheet resistance increases with polishing, but the low sheet resistance associated with a larger grain size transparent conducting layer may offset this increase in sheet resistance due to polishing. Thus what previously may have been thought of as an unsuitable substrate upon which to fabricate an electrochromic device is converted into a highly suitable substrate using methods described herein.

Polishing according to methods described herein can achieve typical surface roughness on the order of a few nanometers Ra, without having to rely on, e.g., magnetorheological finishing (MRF) or high energy laser treatment. In one embodiment, the transparent coating's roughness is polished to an Ra of between about 1 nm and about 10 nm, in another embodiment between about 1 nm and about 5 nm, in another embodiment between about 2 nm and about 3 nm.

After polishing, the transparent substrate is cleaned to remove any abrasives remaining. The transparent substrate is then ready for fabrication of the electrochromic device thereon, e.g., by sequentially depositing an electrochromic device using a single integrated deposition system having a controlled ambient environment in which the pressure and/or gas composition are controlled independently of an external environment outside of the integrated deposition system, and the substrate does not leave the integrated deposition system at any time during the sequential deposition device stack.

Exemplary solid state electrochromic devices, methods, and apparatus for making them and methods of making electrochromic windows with such devices are described in U.S. Non-provisional patent application Ser. No. 12/645,111, entitled "Fabrication of Low Defectivity Electrochromic Devices," by Kozlowski et al., U.S. Non-provisional patent application Ser. No. 12/645,159, entitled "Electrochromic Devices," by Wang et al., and U.S. application Ser. No. 12/772,055, filed Apr. 30, 2010, entitled "Electrochromic Devices", each of which is incorporated by reference herein for all purposes. One embodiment of fabricating an electrochromic device in accord with methods described herein is presented below.

Figure 1:
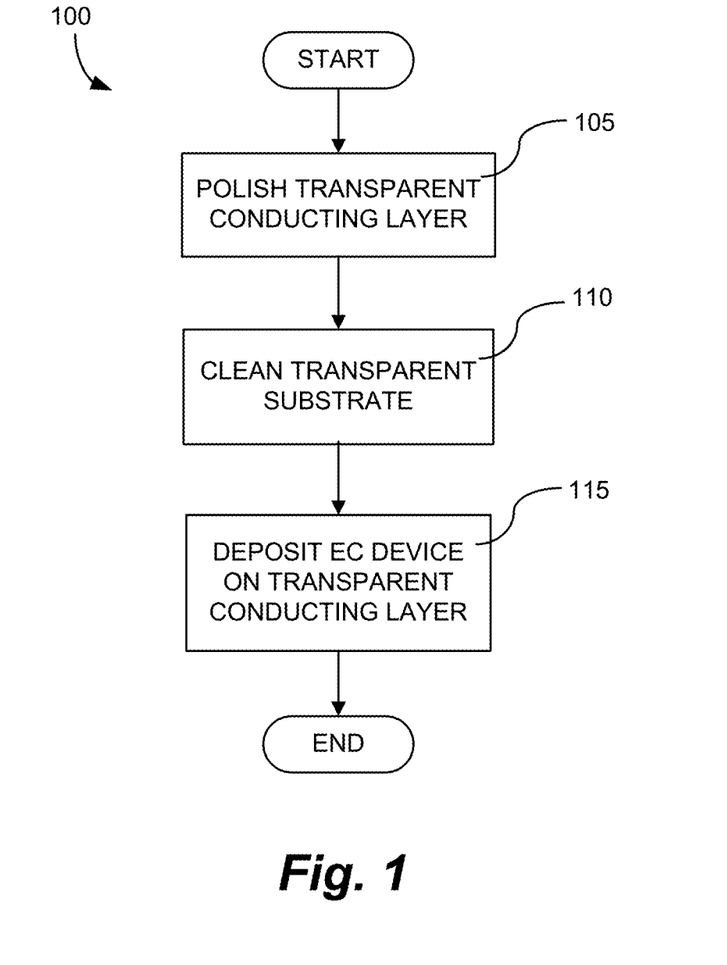
FIG. 1 is a process flow outlining aspects of methods described herein.

FIG. 1 is a process flow, 100, in accord with methods disclosed herein. Specifically, after a transparent substrate having a transparent conducting layer thereon is received, the transparent conducting layer is polished mechanically, see 105. If the transparent substrate is, e.g. float glass, it may be tempered prior to, or post, polishing. Polishing can be done by hand or by automated polishing apparatus that is, e.g., computer controlled to polish to the desired surface roughness and/or sheet resistance level of the transparent conducting layer. In one embodiment, the sheet resistance of the transparent conducting layer is measured periodically during the polishing operation in order to guide the polishing level. After the transparent conducting layer is polished, the transparent substrate is cleaned to remove abrasive particles and any contaminants, see 110. Cleaning may include using detergents, surfactants, and the like, well known to skilled artisans. After cleaning, an electrochromic device is fabricated on the transparent conducting layer, see 115, and the method is complete. Below is described a specific fabrication method of depositing an electrochromic device on a transparent conducting layer, which has been polished and cleaned as described herein.

Figure 2:
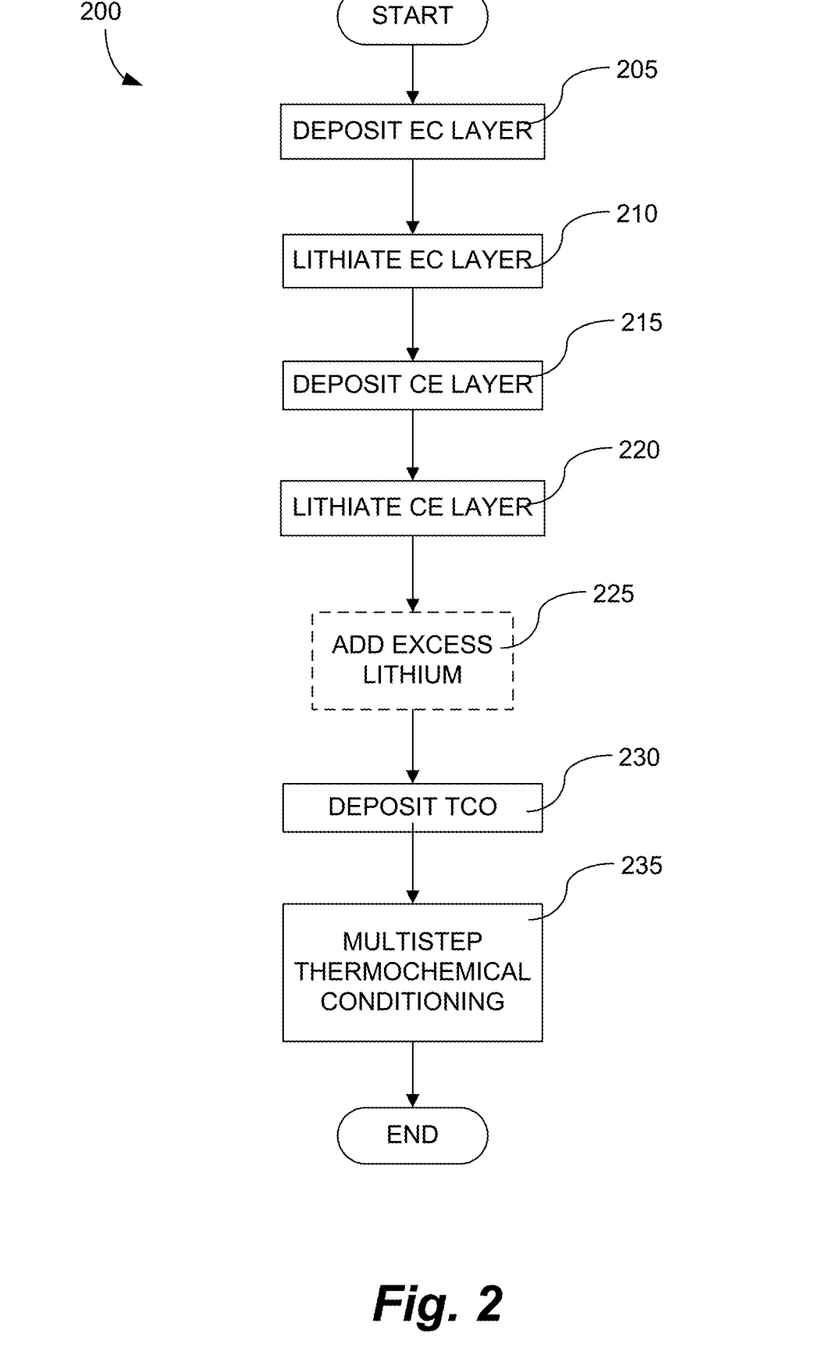
FIG. 2 is a process flow outlining aspects of a method of forming an all solid state and inorganic electrochromic device.

FIG. 2 is a process flow, 200, for depositing an electrochromic (EC) layer (see 205), then a counter electrode (CE) layer (see 215) and ultimately forming an interfacial region, functioning as an ion conducting (IC) layer there between. In the described embodiment, the EC layer includes $WO_3$ with various amounts of oxygen, in particular compositions and configurations; the CE layer includes NiWO; the interfacial region includes $Li_2WO_4$, and, the transparent conducting oxide (TCO) layer includes transparent conducting oxide (TCO) materials such as indium tin oxide and fluorinated tin oxide. Different materials can be used in one or more of the layers of the electrochromic device of other embodiments.

It should be noted that the layers of the electrochromic devices are described below in terms of solid state materials. Solid state materials are desirable because of reliability, consistent characteristics and process parameters, and device performance. In particular embodiments, the electrochromic devices disclosed herein are entirely solid state and made in apparatus that allow deposition of one or more layers of the stack in a controlled ambient environment. That is, in apparatus where the layers are deposited without leaving the apparatus and without, for example, breaking vacuum between deposition steps, thereby reducing contaminants and ultimately improving device performance. In a particular embodiment, apparatus described herein do not require a separate target for depositing an IC layer, as is required in conventional apparatus. As one of ordinary skill in the art would appreciate, the embodiments disclosed herein are not limited to these materials and methods; however, in certain embodiments, all of the materials making up electrochromic stack are both inorganic and solid.

Figure 3:
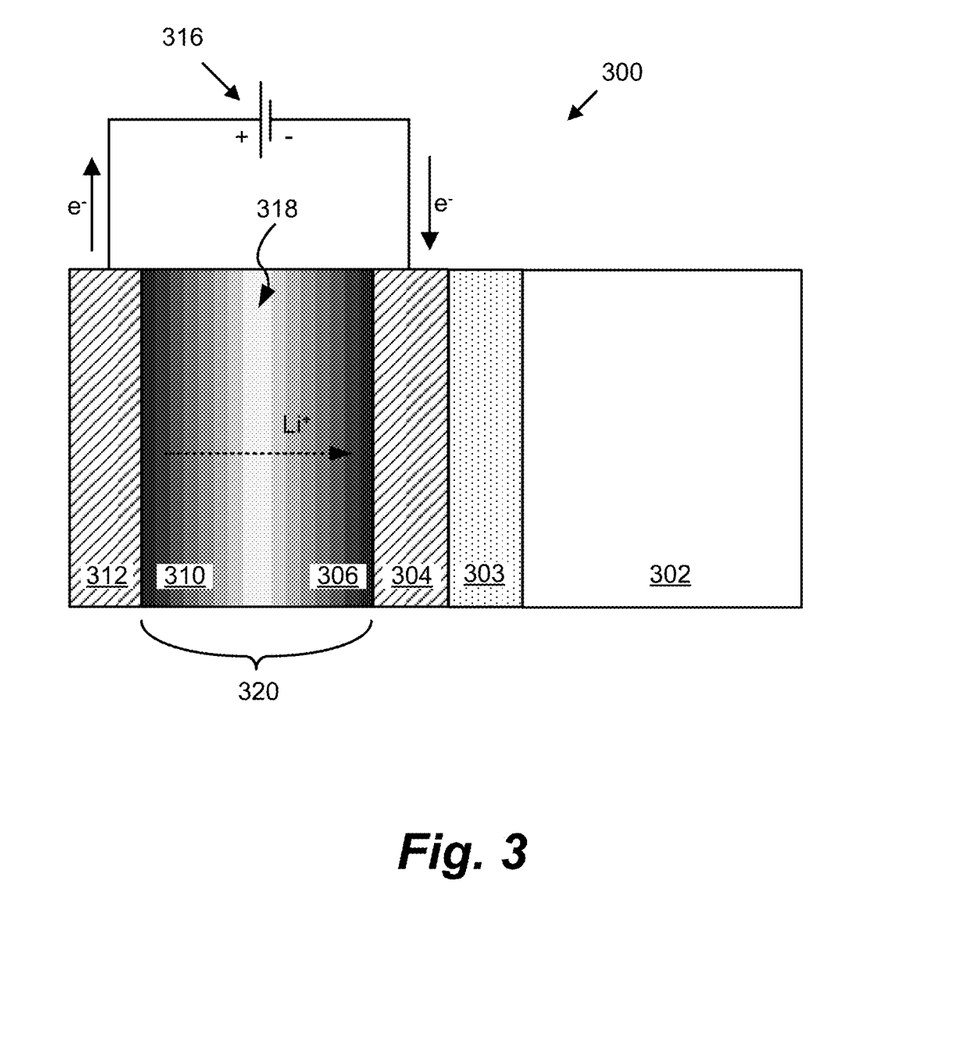
FIG. 3 is a schematic rendering of an electrochromic device on a substrate.

Referring again to FIG. 2, first an EC layer of $WO_3$ is deposited, see 205. FIG. 3 is a schematic cross-section depicting formation of an electrochromic device in accord with process flow 200. Specifically, FIG. 3 is used to show a non-limiting example of how an EC layer including $WO_3$ can be formed as part of a stack, where an interfacial region serving as an IC layer is formed after or while the other layers of the stack are deposited.

Referring to FIG. 3, a layered structure, 300, is depicted. The layered structure includes a substrate, 302, which is, for example, glass. Suitable glasses include either clear or tinted soda lime glass, including soda lime float glass. The glass may be tempered or not. Examples of commercially available glass substrates that have a transparent conductive layer coating include conductive layer coated glasses sold under the trademark TEC Glass™ by Pilkington of Toledo, Ohio, and SUNGATE™ 300 and SUNGATE™ 500 by PPG Industries of Pittsburgh, Pa. TEC Glass™ is a glass coated with a pyrolytically applied fluorinated tin oxide conductive layer (TEC layer). This TEC layer is an exemplary transparent conductive layer that may be polished according to methods described herein. The TEC layer is very hard and resistant to polishing, therefore alumina has been found to be a particularly useful abrasive in polishing TEC layers, since alumina is much harder than TEC. Layer 303 is a sodium diffusion barrier and layer 304 is the polished transparent conductive layer.

In some embodiments, the optical transmittance (i.e., the ratio of transmitted radiation or spectrum to incident radiation or spectrum) of substrate 302 may be, for example, about 90 to 95%, or about 90 to 92%. The substrate may be of any thickness, as long as it has suitable mechanical properties to support the electrochromic device. While substrate 302 may be of any size, in some embodiments, it is about 0.01 mm to about 10 mm thick, or about 3 mm to about 9 mm thick. In one embodiment, where the substrate is to be incorporated into an insulated glass unit, and the substrate is 20 inches by 20 inches or larger, e.g. up to 72 inches by 120 inches, 6 mm glass is often used, as it represents a good balance between strength and weight considerations (e.g. 9 mm glass is 50% heavier than 6 mm glass, while not providing significant strength advantage over 6 mm glass).

In some embodiments, the substrate is architectural glass. Architectural glass is glass that is used as a building material. Architectural glass is typically used in commercial buildings, but may also be used in residential buildings, and typically, though not necessarily, separates an indoor environment from an outdoor environment. In certain embodiments, architectural glass is at least about 20 inches by 20 inches, and can be much larger, for example, as large as about 72 inches by 120 inches. Architectural glass is typically at least about 2 mm thick. Architectural glass that is less than about 3.2 mm thick cannot be tempered. In some embodiments with architectural glass as the substrate, the substrate may still be tempered even after the electrochromic stack has been fabricated on the substrate. In some embodiments with architectural glass as the substrate, the substrate is a soda lime glass from a tin float lime. The percent transmission over the visible spectrum of an architectural glass substrate (i.e., the integrated transmission across the visible spectrum) is generally greater than about 80% for neutral substrates, but it could be lower for colored substrates. The percent transmission of the substrate over the visible spectrum may be at least about 90% (for example, about 90 to 92%). The visible spectrum is the spectrum that a typical human eye will respond to, generally about 380 nm (purple) to about 780 nm (red). In one embodiment, the transparent conducting layer 304 has a surface roughness of about 1 nm to about 5 nm, in another embodiment, about 2 nm to about 3 nm. For the purposes of further description, "substrate 302" refers collectively to layers 302, 303 and 304.

Transparent conductive layers described herein (e.g., layers 304 and 312), include transparent conductive oxides (TCOs) materials including metal oxides and metal oxides doped with one or more metals. Examples of such metal oxides and doped metal oxides include indium oxide, indium tin oxide, doped indium oxide, tin oxide, doped tin oxide, zinc oxide, aluminum zinc oxide, doped zinc oxide, ruthenium oxide, doped ruthenium oxide, and the like. In one embodiment, the transparent conductive layer 304 with TCO materials is about 20 nm to about 1200 nm thick, in another embodiment, about 100 nm to about 600 nm thick, in another embodiment about 350 nm thick. The transparent conductive layers with TCO materials (i.e., 304 and 312) have an appropriate sheet resistance ($R_s$) due to the relatively large area spanned by the layers. In some embodiments, the sheet resistance of one or more of the transparent conductive layers 304 and 312 is about 5 to about 30 Ohms per square. In some embodiments, the sheet resistance of one or more of the transparent conductive layers 304 and 312 is about 15 Ohms per square. It may be desirable that the sheet resistance of each of the two transparent conductive layers (i.e., 304 and 312) to be about the same in some cases. In one embodiment, the two transparent conductive layers, for example layers 304 and 312, each have a sheet resistance of about 10 to 15 Ohms per square. In one embodiment, the transparent conductive layer (e.g., 304 or 312) may be polished using methods described herein while the measured sheet resistance of the transparent conductive layer remains at or below an acceptable level (e.g., levels in the range of 5 to about 30 Ohms per square). Some examples of acceptable levels include 5, 10, 15, 20, 25, and 30 Ohms per square.

Consistent with process flow 200 of FIG. 2, the device stack 320 of FIG. 3 includes an electrochromic layer, 306, deposited on top of a first (polished) transparent conductive 304 (i.e. transparent conductive layer having TCO materials). The electrochromic layer (e.g., 306) may contain any one or more of a number of different electrochromic materials, including metal oxides. Such metal oxides include, for example, tungsten oxide ($WO_3$), molybdenum oxide ($MoO_3$), niobium oxide ($Nb_2O_5$), titanium oxide ($TiO_2$), copper oxide (CuO), iridium oxide ($Ir_2O_3$), chromium oxide ($Cr_2O_3$), manganese oxide ($Mn_2O_3$), vanadium oxide ($V_2O_5$), nickel oxide ($Ni_2O_3$), cobalt oxide ($Co_2O_3$) and the like. In some embodiments, the metal oxide is doped with one or more dopants such as, for example, lithium, sodium, potassium, molybdenum, niobium, vanadium, titanium, and/ or other suitable metals or compounds containing metals. Mixed oxides (for example, W—Mo oxide, W—V oxide) are also used in certain embodiments, that is, the electrochromic layer may include two or more of the aforementioned metal oxides. An electrochromic layer (e.g., 306) including a metal oxide is capable of receiving ions transferred from a counter electrode layer (e.g., layer 310).

In some embodiments, tungsten oxide or doped tungsten oxide is used for the electrochromic layer (e.g., layer 306). In one embodiment, the electrochromic layer is made substantially of $WO_x$, where "x" refers to an atomic ratio of oxygen to tungsten in the electrochromic layer, and x is about 2.7 to 3.5. It has been suggested that only sub-stoichiometric tungsten oxide exhibits electrochromism; i.e., that stoichiometric tungsten oxide, $WO_3$, does not exhibit electrochromism. In a more specific embodiment, $WO_x$, where x is less than 3.0 and at least about 2.7 is used for the electrochromic layer. In another embodiment, the electrochromic layer is $WOx$, where x is about 2.7 to about 2.9. Techniques such as Rutherford Backscattering Spectroscopy (RBS) can identify the total number of oxygen atoms which include those bonded to tungsten and those not bonded to tungsten. In some instances, tungsten oxide layers where x is 3 or greater exhibit electrochromism, presumably due to unbound excess oxygen along with sub-stoichiometric tungsten oxide. In another embodiment, the tungsten oxide layer has stoichiometric or greater oxygen, where x is about 3.0 to about 3.5. In some embodiments, at least a portion of the EC layer has an excess of oxygen. This more highly oxygenated region of the EC layer is used as a precursor to formation of an ion conducting electron insulating region which serves as an IC layer. In other embodiments, a distinct layer of highly oxygenated EC material is formed between the EC layer and the CE layer for ultimate conversion, at least in part, to an ion conducting electronically-insulating interfacial region.

In certain embodiments, the tungsten oxide is crystalline, nanocrystalline, or amorphous. In some embodiments, the tungsten oxide is substantially nanocrystalline, with grain sizes, on average, from about 5 nm to 50 nm (or from about 5 nm to 20 nm), as characterized by transmission electron microscopy (TEM). The tungsten oxide morphology or microstructure may also be characterized as nanocrystalline using x-ray diffraction (XRD) and/or electron diffraction, such as selected area electron diffraction (SAED). For example, nanocrystalline electrochromic tungsten oxide may be characterized by the following XRD features: a crystal size of about 10 to 100 nm, for example, about 55 nm. Further, nanocrystalline tungsten oxide may exhibit limited long range order, for example, on the order of several (about 5 to 20) tungsten oxide unit cells.

The remainder of process flow 200, in FIG. 2, including the formation of EC layer 306, will be further described in relation to an embodiment, represented in FIG. 3. As mentioned with reference to FIG. 2, an EC layer is deposited, see 205. In embodiments such as the illustrated embodiment of FIG. 3, a substantially homogeneous EC layer, 306, including $WO_3$ is formed as part of stack 320, where the EC layer 306 is in direct contact with a CE layer 310. In one embodiment, the EC layer 306 includes $WO_3$ as described above. In one embodiment, heating is applied during deposition of at least a portion of the $WO_3$. In one embodiment, several passes are made past a sputter target, where a portion of the $WO_3$ is deposited on each pass, and heating is applied, for example to substrate 302, after each deposition pass to condition the $WO_3$ prior to deposition of the next portion of $WO_3$ of EC layer 306. In other embodiments, the $WO_3$ layer may be heated continually during deposition, and deposition can be done in a continuous manner, rather than several passes with a sputter target. In one embodiment, the EC layer 306 is about 300 nm to about 600 nm thick. As mentioned, the thickness of the EC layer 306 depends on upon the desired outcome and method of forming the interfacial region 180, which serves as an IC layer.

In embodiments described in relation to FIG. 3, the EC layer includes $WO_3$, about 500 nm to about 600 nm thick, that is sputtered using a tungsten target and a sputter gas including about 40% to about 80% $O_2$ and about 20% Ar to about 60% Ar, and where the substrate upon which the $WO_3$ is deposited is heated, at least intermittently, to about 150° C. to about 450° C. during formation of the EC layer. In a particular embodiment, the EC layer includes $WO_3$, about 550 nm thick, sputtered using the tungsten target, where the sputter gas includes about 50% to about 60% $O_2$ and about 40% to about 50% Ar, and the substrate upon which the $WO_3$ is deposited is heated, at least intermittently, to about 250° C. to about 350° C. during formation of the electrochromic layer. In these embodiments, the $WO_3$ of the EC layer is substantially homogenous. In one embodiment, the $WO_3$ of the EC layer is substantially polycrystalline. It is believed that heating the $WO_3$, at least intermittently, during deposition aids in formation of a polycrystalline form of the $WO_3$. It is important that the surface roughness of the transparent conducting layer (e.g., TEC layer) is reduced, particularly when a crystalline layer, such as crystalline $WO_3$, is to be used atop the transparent conducting layer.

As mentioned herein, a number of materials are suitable for the EC layer (e.g., layer 306) of embodiments. Generally, in electrochromic materials, the colorization (or change in any optical property—for example, absorbance, reflectance, and transmittance) of the electrochromic material is caused by reversible ion insertion into the material (for example, intercalation) and a corresponding injection of a charge balancing electron. Typically, some fraction of the ion responsible for the optical transition is irreversibly bound up in the electrochromic material. As described herein, some or all of the irreversibly bound ions are used to compensate "blind charge" in the material. In most electrochromic materials, suitable ions include lithium ions ($Li^+$) and hydrogen ions ($H^+$) (i.e., protons). In some cases, however, other ions will be suitable. These include, for example, deuterium ions ($D^+$), sodium ions ($Na^+$), potassium ions ($K^+$), calcium ions ($Ca^{++}$), barium ions ($Ba^{++}$), strontium ions ($Sr^{++}$), and magnesium ions ($Mg^{++}$). In various embodiments described herein, lithium ions are used to produce the electrochromic phenomena. Intercalation of lithium ions into tungsten oxide ($WO_{3-y}$ ($0<y\leq\sim0.3$)) causes the tungsten oxide to change from transparent (bleached state) to blue (colored state). In a typical process where the EC layer includes or is tungsten oxide, lithium is deposited, for example via sputtering, on the EC layer (e.g., layer 306) to satisfy the blind charge, see 225 of the process flow in FIG. 2. In one embodiment, the lithiation is performed in an integrated deposition system where vacuum is not broken between deposition steps. It should be noted that in some embodiments, lithium is not added at this stage, but rather can be added after deposition of the counter electrode layer or in other embodiments lithium is added after the second TCO (e.g., 312 in FIG. 3) is deposited. In the context of the described embodiments, successful intercalation of lithium into the device layers may depend on the morphology of the layers, which in turn can be adversely affected by too high surface roughness of the transparent conductor upon which they are fabricated.

In embodiments, lithiation can be performed at or between one or more steps in the process of depositing the EC device on polished transparent conducting layer 304 as described at step 115 of FIG. 1. For example, lithium can be added after deposition of the electrochromic layer, after deposition of the counter electrode layer (e.g., 310), or both. As another example, lithium can be added after the second TCO 312 is deposited. In the illustrated example of FIG. 2, lithium is added at step 215 after the deposition of the electrochromic layer at step 210, lithium is added at step 220 after the deposition of the counter electrode layer at step 215, and excess lithium is added at step 225 after step 220.

Referring again to FIG. 3, a counter electrode layer, 310, is deposited on an electrochromic layer 306. In some embodiments, the counter electrode layer 310 is inorganic and/or solid. The counter electrode layer 310 may include one or more of a number of different materials that are capable of serving as reservoirs of ions when the electrochromic device is in the bleached state. During an electrochromic transition initiated by, for example, application of an appropriate electric potential, the counter electrode layer 310 transfers some or all of the ions it holds to the electrochromic layer 306, changing the electrochromic layer 306 to the colored state. Concurrently, in the case of NiO and/or NiWO, the counter electrode layer 310 colors with the loss of ions.

In some embodiments, suitable materials for the counter electrode layer 310 include nickel oxide (NiO), nickel tungsten oxide (NiWO), nickel vanadium oxide, nickel chromium oxide, nickel aluminum oxide, nickel manganese oxide, nickel magnesium oxide, chromium oxide ($Cr_2O_3$), manganese oxide ($MnO_2$), and Prussian blue. Optically passive counter electrodes include cerium titanium oxide ($CeO_2$—$TiO_2$), cerium zirconium oxide ($CeO_2$—$ZrO_2$), nickel oxide (NiO), nickel-tungsten oxide (NiWO), vanadium oxide ($V_2O_5$), and mixtures of oxides (for example, a mixture of $Ni_2O_3$ and $WO_3$). Doped formulations of these oxides may also be used, with dopants including, for example, tantalum and tungsten. Because the counter electrode layer 310 contains the ions used to produce the electrochromic phenomenon in the electrochromic material when the electrochromic material is in the bleached state, the counter electrode layer 310 may have a high transmittance and a neutral color when it holds significant quantities of these ions. The counter electrode layer 310 morphology may be crystalline, nanocrystalline, or amorphous.

In some embodiments, where the counter electrode layer 310 is nickel-tungsten oxide, the counter electrode material is amorphous or substantially amorphous. Substantially amorphous nickel-tungsten oxide counter electrodes have been found to perform better, under some conditions, in comparison to their crystalline counterparts. The amorphous state of the nickel-tungsten oxide may be obtained through the use of certain processing conditions, described below. Amorphous nickel-tungsten oxide may be produced by relatively higher energy atoms in the sputtering process. Higher energy atoms are obtained, for example, in a sputtering process with higher target powers, lower chamber pressures (i.e., higher vacuum), and smaller source to substrate distances. Under the described process conditions, higher density films, with better stability under UV/heat exposure are produced.

In certain embodiments, the amount of nickel present in the nickel-tungsten oxide can be up to about 90% by weight of the nickel tungsten oxide. In a specific embodiment, the mass ratio of nickel to tungsten in the nickel tungsten oxide is about 4:6 to 6:4, in one example, about 1:1. In one embodiment, the NiWO is about 15% (atomic) Ni to about 60% Ni, and about 10% W to about 40% W. In another embodiment, the NiWO is about 30% (atomic) Ni to about 45% Ni, and about 15% W to about 35% W. In yet another embodiment, the NiWO is about 30% (atomic) Ni to about 45% Ni, and about 20% W to about 30% W. In yet another embodiment, the NiWO is about 42% (atomic) Ni and about 14% W.

In embodiments such as the illustrated embodiment of FIG. 2, the CE layer 310 includes NiWo and is a NiWO CE layer as described above. In one embodiment, the CE layer 310 is about 150 nm to about 300 nm thick, in another embodiment about 200 nm to about 250 nm thick, in another embodiment about 230 nm thick.

In a typical process of an embodiment, lithium is also applied to the CE layer until the CE layer is bleached. It should be understood that reference to a transition between a colored state and bleached state is non-limiting and suggests only one example, among many, of an electrochromic transition that may be implemented. Unless otherwise specified herein, whenever reference is made to a bleached-colored transition, the corresponding device or process encompasses other optical state transitions such non-reflective-reflective, transparent-opaque, etc. Further, the term "bleached" refers to an optically neutral state, for example, uncolored, transparent, or translucent. Still further, unless specified otherwise herein, the "color" of an electrochromic transition is not limited to any particular wavelength or range of wavelengths. As understood by those of skill in the art, the choice of appropriate electrochromic and counter electrode materials governs the relevant optical transition.

In a particular embodiment, lithium, for example via sputtering, is added to a NiWO CE layer, see 220 of FIG. 2. In a particular embodiment, an additional amount of lithium is added after sufficient lithium has been introduced to fully bleach the NiWO, see 225 of FIG. 2 (this process step 225 is optional, and in one embodiment excess lithium is not added at this stage in the process). In one embodiment, this additional amount is about 5% to about 15% excess lithium based on the quantity required to bleach the counter electrode layer. In another embodiment, the excess lithium added to the CE layer is about 10% excess based on the quantity required to bleach the counter electrode layer. After CE layer 310 is deposited, bleached with lithium and additional lithium is added, a second TCO layer, 312, is deposited on top of the counter electrode layer, see 230 of FIG. 2. In one embodiment, the second TCO layer 312 includes indium tin oxide, in another embodiment, the second TCO layer is indium tin oxide. In one embodiment, this second TCO layer 312 is about 20 nm to about 1200 nm thick, in another embodiment about 100 nm to about 600 nm thick, and in another embodiment about 350 nm thick.

Referring again to FIG. 3, once layered structure 300 is complete, it is subjected to thermochemical conditioning which converts at least a portion of stack 320 to a region functioning as an IC layer (if it was not already converted due to lithium diffusion or other mechanism). In particular, an interfacial region, 318, serving as an ion conducting but electrically insulating layer, is formed between layers 310 and 306 after or during deposition of layers 306 and 310. This interfacial region 318 may span a very thin space between the EC and CE layers; that is, it is believed to be a diffuse but relatively localized region between the electrochromic and counter electrode layers. Thus it is not a layer itself in the conventional sense. Surface roughness of the first (polished) transparent conducting layer 304 upon which the electrochromic device is fabricated may disrupt this interfacial region 318 and thereby dramatically adversely affect the function of the interfacial region 318. Methods described herein avoid this result.

Referring again to FIG. 2, layered structure 300 is subjected to a multistep thermochemical conditioning (MTCC), see 235. In one embodiment, the stack is first subjected to heating, under inert atmosphere (e.g., argon) at about 150° C. to about 450° C., for about 10 minutes to about 30 minutes, and then for about 1 minute to about 15 minutes under $O_2$. In another embodiment, the stack is heated at about 250° C. for about 15 minutes under inert atmosphere, and then about 5 minutes under $O_2$. Next, layered structure 300 is subjected to heating in air. In one embodiment, the stack is heated in air at about 250° C. to about 350° C., for about 20 minutes to about 40 minutes; in another embodiment, the stack is heated in air at about 300° C. for about 30 minutes. The energy required to implement MTCC need not be radiant heat energy. For example, in one embodiment ultraviolet radiation is used to implement MTCC. Other sources of energy could also be used.

After the MTCC at 235, process flow 200 is complete and a functional electrochromic device is created. It is believed that the lithium in stack 320 along with a portion of EC layer 306 and/or CE layer 310 may combine to form interfacial region 318 which functions as an IC layer. Interfacial region 318 is believed to be primarily lithium tungstate, $Li_2WO_4$, which is known to have good ion conducting and electronically-insulating properties relative to traditional IC layer materials. As discussed above, precisely how this phenomenon occurs is not yet known. There are chemical reactions that must take place during the MTCC to form the ion conducting electronically-insulating region 318 between the EC and CE layers, but also it is thought that an initial flux of lithium traveling through the stack, for example provided by the excess lithium added to the CE layer as described above, plays a part in formation of interfacial region 318. The thickness of the ion conducting electronically-insulating region may vary depending on the materials employed and process conditions for forming the region. In some embodiments, interfacial region 318 is about 10 nm to about 150 nm thick, in another embodiment about 20 nm to about 100 nm thick, and in other embodiments about 30 nm to about 50 nm thick. Thickness in this respect does not refer to a defined layer, as region 318 seems to be a graded composition that varies in density; however it lies between EC layer 306 and CE layer 310.

As mentioned above, there are a number of suitable materials for making the EC layer 308. As such, using, for example lithium or other suitable ions, in the methods described above one can make other interfacial regions that function as IC layers starting from oxygen rich EC materials. Suitable EC materials for this purpose include, but are not limited to $SiO_2$, $Nb_2O_5$, $Ta_2O_5$, $TiO_2$, $ZrO_2$ and $CeO_2$. In particular embodiments where lithium ions are used, ion conducting materials such as but not limited to, lithium silicate, lithium aluminum silicate, lithium aluminum borate, lithium aluminum fluoride, lithium borate, lithium nitride, lithium zirconium silicate, lithium niobate, lithium borosilicate, lithium phosphosilicate, and other such lithium-based ceramic materials, silicas, or silicon oxides, including lithium silicon-oxide can be made as interfacial regions that function as IC layers.

In one embodiment, the precursor of the ion conducting interfacial region is an oxygen-rich (super-stoichiometric) layer that is transformed into an ion-conducting/electron-insulating region via lithiation and MTCC as described herein. It is believed that upon lithiation, the excess oxygen may form lithium oxide, which further forms lithium salts, that is, lithium electrolytes, such as lithium tungstate ($Li_2WO_4$), lithium molybdate ($Li_2MoO_4$), lithium niobate ($LiNbO_3$), lithium tantalate ($LiTaO_3$), lithium titanate ($Li_2TiO_3$), lithium zirconate ($Li_2ZrO_3$) and the like. In one embodiment, the interfacial region comprises at least one of tungsten oxide ($WO_{3+x}$, $0 \leq x \leq 1.5$), molybdenum oxide ($MoO_{3+x}$, $0 \leq x \leq 1.5$), niobium oxide ($Nb_2O_{5+x}$, $0 \leq x \leq 2$), titanium oxide ($TiO_{2+x}$, $0 \leq x \leq 1.5$), tantalum oxide ($Ta_2O_{5+x}$, $0 \leq x \leq 2$), zirconium oxide ($ZrO_{2+x}$, $0 \leq x \leq 1.5$), and cerium oxide ($CeO_{2+x}$, $0 \leq x \leq 1.5$).

Any material, however, may be used for the ion conducting interfacial region 318 provided it can be fabricated with low defectivity and it allows for the passage of ions between the counter electrode layer 310 to the electrochromic layer 306 while substantially preventing the passage of electrons. The material may be characterized as being substantially conductive to ions and substantially resistive to electrons. In one embodiment, the ion conductor material has an ionic conductivity of about $10^{-10}$ Siemens/cm (or $ohm^{-1}$ $cm^{-1}$) to about $10^{-3}$ Siemens/cm and an electronic resistivity of greater than about $10^5$ ohms-cm. In another embodiment, the ion conductor material has an ionic conductivity of about $10^{-8}$ Siemens/cm to about $10^{-3}$ Siemens/cm and an electronic resistivity of greater than about $10^{10}$ ohms-cm. While ion conducting layers should generally resist leakage current (for example, providing a leakage current of not more than about 15 $\mu A/cm^2$ or not more than about 10 $\mu A/cm^2$, or not more than about 5 $\mu A/cm^2$. It has been found that some electrochromic devices fabricated as described herein have surprising high leakage currents, for example, about 40 $\mu A/cm$ to about 150 $\mu A/cm$, yet provide good color change across the device and operate efficiently. There is the possibility that formation of the interfacial region may be self-limiting and may depend on relative amounts of oxygen, lithium, electrochromic material and/or counter electrode material in the stack.

In accord with the forgoing, one embodiment is a method of fabricating an electrochromic device, the method including: a) receiving a glass substrate having a first transparent conductive coating thereon; b) polishing the first transparent conductive coating using an alumina slurry having an average particle size of between about 0.1 µM and about 1 µM; and c) depositing on the polished transparent conductive coating the electrochromic device, the electrochromic device comprising a tungsten oxide electrochromic layer, a nickel tungsten oxide counter electrode layer and a second transparent conducting layer, wherein the electrochromic device is fabricated in an apparatus where the layers are deposited without leaving the apparatus and without breaking vacuum. In one embodiment, the glass substrate is tempered glass and the first transparent conductive coating is a tin oxide based material. In another embodiment, the glass substrate is non-tempered float glass and the first transparent conductive coating is a tin oxide based material. In one embodiment, the alumina slurry has an average particle size of between about 0.25 µM and about 1 µM. In certain embodiments, c) further includes deposition of lithium metal. In one embodiment, the electrochromic device is all solid state and inorganic. In one embodiment, the electrochromic device is as described herein.

EXAMPLE

A sample of float glass coated with a sodium diffusion barrier layer and a fluorinated tin oxide conductive layer thereon (TEC 15 Glass™ by Pilkington of Toledo, Ohio) was cut to 26×30 inches and tempered in a tempering furnace. The glass light was polished on the transparent conducting coating side using a hand-held rotary polishing tool (Makita 9225C) having a polishing pad made of felt and using a pre-mixed slurry polishing solution (1 µm alumina ($Al_2O_3$) particles in a water based slurry with dispersants) obtained from Pace Technologies of Tucson Ariz. The felt pad was kept wet with the alumina slurry during polishing.

The polishing time was determined by measuring the sheet resistance (Rs) value and polishing until the Rs remained at an acceptable level. The sheet resistance increases with increased polishing time because the thickness of the transparent conducting layer diminishes with increased polishing. For example, TEC 15 glass starts with a Rs of ~13 Ohms/Sq, and was polished until the Rs was 25 Ohms/Sq. The Rs was measured using a hand-held 4-pt probe device. For a 26×30 inch transparent substrate, the polishing to reach the Rs value above was about 90 minutes.

Studies on smaller area transparent substrates show that the Ra was improved by more than 2.5 times. The table below shows the Ra, Rq, and Rmax values before and after polishing. Similar results were obtained using ceria (cerium oxide, $CeO_2$) as the abrasive agent. Ra and Rq are profile surface roughness parameters. Ra is the average roughness and Rq is the root mean squared roughness.

After polishing, the glass surface is cleaned with a polish (cleaning) solution from GlassRenu of Pacheco, Calif. Then the glass is hand-washed in a tub of water to remove additional polishing powder from the glass edges. Next, the glass is washed in an automatic cleaner such as a commercial tool made by Lisec™ (a trade name for a glass washing apparatus and process available from Maschinenbau Gmbh of Seitenstetten, Austria). The haze of the glass was measured by a spectrophotometer prior to polishing to be 1.3%, and after polishing and cleaning the haze was 0.8%. After cleaning, the glass is then ready for fabrication of an electrochromic device thereon, e.g., as described herein.

|  | Ra (nm) | Rq (nm) | Rmax (nm, 5 µm x 5 µm) |
| --- | --- | --- | --- |
| Unpolished TEC | 6.9 | 8.6 | 66.3 |
| Alumina Polished TEC (10 min) | 2.7 | 3.5 | 31 |

Figure 4:
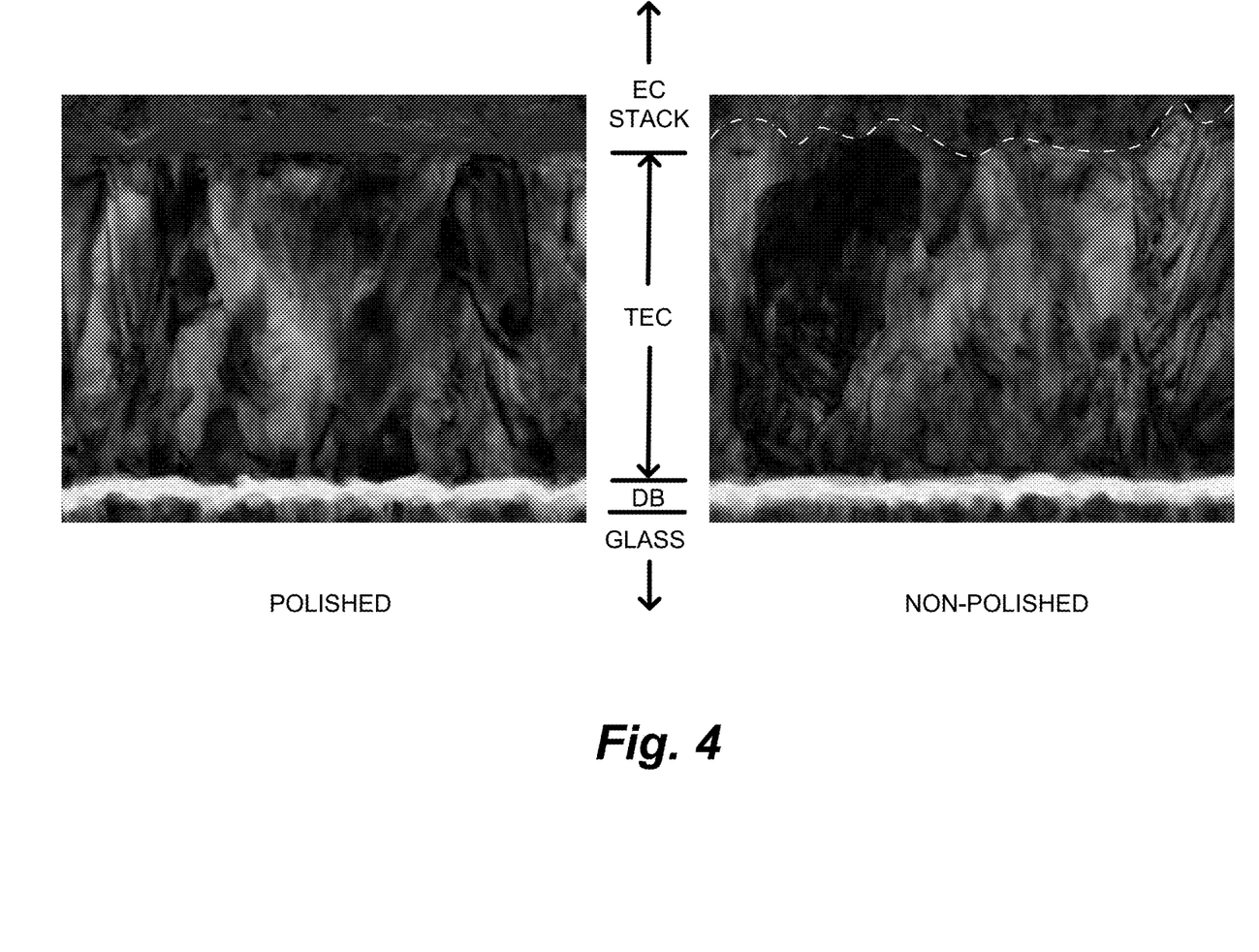
FIG. 4 includes transmission electron microscope images (TEMs) of a transparent conductor layer with polishing using methods as described herein as compared to a transparent conducting layer without polish.

FIG. 4 shows TEMs of a transparent conductor layer, in this example a TEC layer, polished and non-polished, left and right TEM, respectively. A white dotted line is superimposed on the TEM of non-polished TEC to show the topology. The polished TEC layer shows a very smooth surface. In this example, the non-polished TEC layer started with a thickness of about 365 nm, and after polishing was about 355 nm thick. An EC device was fabricated on each of the respective TEC covered substrates. The white layer below each TEC layer is a sodium diffusion barrier (denoted "DB") used on the glass substrates (not shown). Electrochromic devices fabricated on substrates processed in the described manner not only display very low haze, but also improved functionality.

A recitation of "transparent conductive layer" or "transparent conductor" is intended to mean "transparent conducting layer" unless specifically indicated to the contrary.

The above description is illustrative and is not restrictive. Many variations of the disclosure will become apparent to those skilled in the art upon review of the disclosure. The scope of the disclosure should, therefore, be determined not with reference to the above description, but instead should be determined with reference to the pending claims along with their full scope or equivalents.

One or more features from any embodiment may be combined with one or more features of any other embodiment without departing from the scope of the disclosure. Further, modifications, additions, or omissions may be made to any embodiment without departing from the scope of the disclosure. The components of any embodiment may be integrated or separated according to particular needs without departing from the scope of the disclosure.

What is claimed is:

1. A method comprising:
    fabricating an electrochromic window by:
        a) polishing a surface of a first transparent conducting layer disposed on a glass substrate; and then
        b) fabricating an all solid state and inorganic electrochromic device on the first transparent conducting layer, wherein:
            the electrochromic device comprises an electrochromic layer, a counter electrode layer and a second transparent conducting oxide layer; and
            the glass substrate is tempered prior to a).

2. The method of claim 1, wherein polishing reduces haze of the first transparent conducting layer to less than 1%.

3. The method of claim 1, wherein the transparent conducting layer is a tin oxide based material.

4. The method of claim 3, wherein the tin oxide based material comprises fluorinated tin oxide.

5. The method of claim 1, wherein a) includes an abrasive preparation comprising particles having a Mohs hardness scale factor of at least 9.

6. The method of claim 5, wherein the abrasive preparation comprises one or both of alumina and carborundum.

7. The method of claim 5, wherein the abrasive preparation is an alumina slurry having an average particle diameter of 250 nm or greater.

8. The method of claim 7, wherein the average particle diameter is about 1 µM.

9. The method of claim 1, wherein a) is performed for between about 10 minutes and about 90 minutes.

10. The method of claim 1, wherein a) is performed until the surface roughness of the transparent conducting layer has an Ra value of between about 1 nm and about 5 nm.

11. The method of claim 1, wherein a) is performed until sheet resistance of the transparent conducting layer is between 5 and 30 Ohms per square.

12. The method of claim 1, wherein sheet resistance of the transparent conducting layer is periodically measured during a).

13. The method of claim 1, wherein:
    the electrochromic layer includes tungsten oxide;
    the counter electrode layer includes nickel tungsten oxide; and
    the second transparent conducting layer includes tin-oxide.

14. The method of claim 1, wherein:
    the electrochromic layer includes tungsten oxide or doped tungsten oxide;

the counter electrode layer includes nickel oxide or nickel tungsten oxide, each optionally doped; and fabricating the electrochromic device includes:

depositing the electrochromic layer in one or more portions on the polished surface;

depositing the counter electrode layer on the electrochromic layer to form a device stack, wherein one or both of the electrochromic layer and the counter electrode layer includes a layer region comprising a greater than stoichiometric amount of oxygen, the layer region being located at the interface of the electrochromic layer and the counter electrode layer; and heating the device stack to convert the layer region to an ion conducting and electrically insulating region between the electrochromic and counter electrode layers.

15. The method of claim 14, further comprising applying lithium to the counter electrode layer prior to heating the device stack.

16. The method of claim 14, wherein heating the device stack includes:

heating the device stack in an inert atmosphere, then, heating the device stack in $O_2$, and, subsequently, heating the device stack in air.

17. The method of claim 14, wherein the ion conducting and electrically insulating region includes one of lithium tungstate, lithium molybdate, lithium niobate, lithium tantalate, lithium titanate, and lithium zirconate.

18. The method of claim 17, wherein the ion conducting and electrically insulating region includes one of tungsten oxide, molybdenum oxide, niobium oxide, titanium oxide, tantalum oxide, zirconium oxide, and cerium oxide.

* * * * *